(12) United States Patent
Kaneko et al.

(10) Patent No.: US 9,076,525 B2
(45) Date of Patent: Jul. 7, 2015

(54) SEMICONDUCTOR STORAGE DEVICE AND METHOD OF CONTROLLING DATA THEREOF

(75) Inventors: Mizuki Kaneko, Yokohama (JP); Tomonori Kurosawa, Zama (JP); Yoichi Minemura, Yokkaichi (JP); Hiroshi Kanno, Yokkaichi (JP); Takafumi Shimotori, Kawasaki (JP); Takayuki Tsukamoto, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 225 days.

(21) Appl. No.: 13/597,773

(22) Filed: Aug. 29, 2012

(65) Prior Publication Data
US 2013/0229850 A1 Sep. 5, 2013

(30) Foreign Application Priority Data

Sep. 26, 2011 (JP) ................................. 2011-208824

(51) Int. Cl.
*G11C 13/00* (2006.01)

(52) U.S. Cl.
CPC ........ *G11C 13/0069* (2013.01); *G11C 13/0004* (2013.01); *G11C 13/0007* (2013.01); *G11C 13/0011* (2013.01); *G11C 2213/72* (2013.01)

(58) Field of Classification Search
CPC ........... G11C 13/0002; G11C 13/0004; G11C 13/0007; G11C 13/0011; G11C 2213/72
USPC .................................... 365/148, 163, 100, 94
See application file for complete search history.

(56) References Cited

U.S. PATENT DOCUMENTS

| | | | |
|---|---|---|---|
| 6,967,865 B2 | 11/2005 | Lee | |
| 7,643,333 B2 * | 1/2010 | Daley | 365/163 |
| 2009/0168504 A1 * | 7/2009 | Lee et al. | 365/163 |
| 2010/0232209 A1 | 9/2010 | Kawabata et al. | |
| 2010/0328988 A1 * | 12/2010 | Nagashima et al. | 365/148 |
| 2011/0032746 A1 | 2/2011 | Maejima et al. | |
| 2011/0128773 A1 | 6/2011 | Azuma et al. | |

FOREIGN PATENT DOCUMENTS

| | | |
|---|---|---|
| JP | 2004-311015 | 11/2004 |
| JP | 2007-4849 | 1/2007 |

(Continued)

OTHER PUBLICATIONS

Japanese Office Action issued Feb. 25, 2014 in Patent Application No. 2011-208824 with English Translation.

*Primary Examiner* — Richard Elms
*Assistant Examiner* — Ajay Ojha
(74) *Attorney, Agent, or Firm* — Oblon, McClelland, Maier & Neustadt, L.L.P.

(57) ABSTRACT

A semiconductor storage device includes a memory cell array, and a control circuit. The memory cell array has memory cells including variable resistive elements disposed at intersections of a plurality of first lines and a plurality of second lines. The control circuit performs a set pulse applying operation, and a cure pulse applying operation. The set pulse applying operation applies a set pulse to a variable resistive element so as to cause the variable resistive element to transition from a high resistance state to a low resistance state. The cure pulse applying operation applies a cure pulse to the variable resistive element. The cure pulse has a polarity that is opposite of a polarity of the set pulse, and is larger than the set pulse.

15 Claims, 10 Drawing Sheets

(56) References Cited

FOREIGN PATENT DOCUMENTS

| JP | 2007-188559 | 7/2007 |
| JP | 2010-218603 | 9/2010 |
| JP | 4642942 | 12/2010 |
| JP | 2011-54259 | 3/2011 |
| JP | 5209151 B1 | 3/2013 |
| WO | WO 2009-145308 A1 | 12/2009 |

* cited by examiner

SEMICONDUCTOR STORAGE DEVICE AND METHOD OF CONTROLLING DATA THEREOF

CROSS-REFERENCE TO RELATED APPLICATIONS

This application is based upon and claims the benefit of priority from the prior Japanese Patent Application No. 2011-208824, filed on Sep. 26, 2011, the entire contents of which are incorporated herein by reference.

FIELD

Embodiments herein relate to a semiconductor storage device, and a method of controlling data thereof.

BACKGROUND

Conventionally, resistance variation memory cell that use a material of which resistance value changes in accordance with an application of a voltage is proposed. Such a resistance variation has two types of operation modes (unipolar and bipolar). The unipolar operation mode causes the memory cell to transition between a high resistance state and a low resistance state by controlling a voltage value and a voltage application time without switching a polarity of the applied voltage. The bipolar operation mode causes the memory cells to transition between the high resistance state and the low resistance state by switching the polarity of the applied voltage.

Due to the bipolar operation mode having a superior directional control compared to the unipolar operation mode, a number of pulse application necessary for causing the transition to the respective states is smaller in the bipolar operation mode than in the unipolar operation mode. Thus, the bipolar operation mode is capable of faster operation than the unipolar operation mode. In the bipolar operation mode, a set pulse is applied upon setting the memory cells in the low resistance state (set state). However, there exist memory cells that do not transition to the set state despite the set pulse being applied. Most of such memory cells do not transition in a setting direction, but rather comes to be in the high resistance state that is at or less than a resetting level.

DETAILED DESCRIPTION

A semiconductor storage device according to an embodiment includes a memory cell array, and a control circuit. In the memory cell array, memory cells including variable resistive elements disposed at intersections of a plurality of first lines and a plurality of second lines. The control circuit applies a voltage to a memory cell disposed at an intersection of a selected first line and a selected second line by applying predetermined voltages on the selected first line and the selected second line. The control circuit performs set pulse and cure pulse applying operations. The set pulse applying operation applies a set pulse to a variable resistive element so as to cause the variable resistive element to transition from a high resistance state to a low resistance state. The cure pulse applying operation applies a cure pulse to the variable resistive element if a resistance value of the variable resistive element does not decrease to a predetermined value or less by the set pulse applying operation. The cure pulse has a polarity that is opposite of a polarity of the set pulse, and is larger than the set pulse.

Hereinbelow, the semiconductor storage device of the embodiment will be described with reference to the drawings.

Embodiment

Configuration

Figure 1:
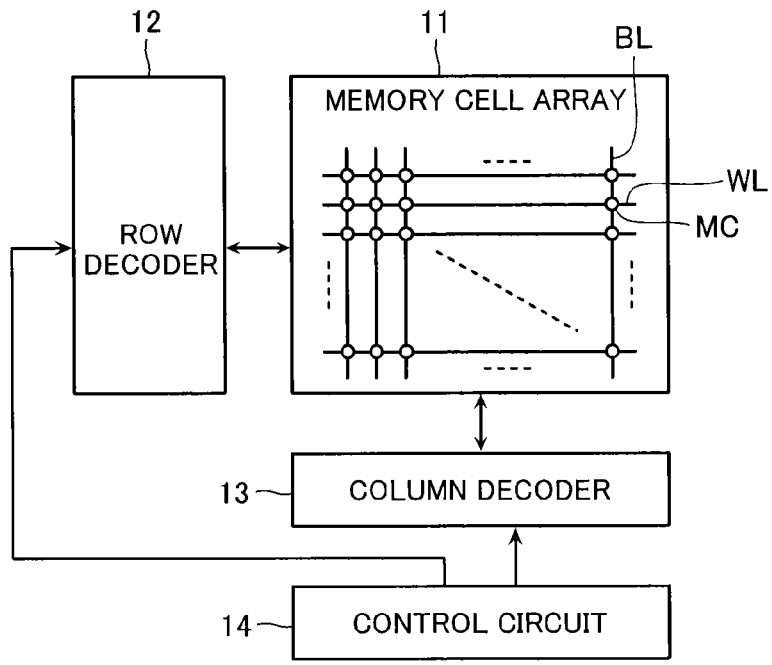
FIG. 1 is a block diagram of a semiconductor storage device of an embodiment.

FIG. 1 is a block diagram of the semiconductor storage device of the embodiment. As shown in FIG. 1, the semiconductor storage device of the embodiment includes a memory cell array 11, a row decoder 12, a column decoder 13, and a control circuit 14.

The memory cell array 11 includes a plurality of word lines WL, a plurality of bit lines BL that intersects with the word lines WL, and memory cells MC disposed at respective intersections of the bit lines BL and the word lines WL. The row decoder 12 selects a word line WL based on a row address, and applies a voltage necessary for respective operations to the word line WL. The column decoder 13 selects a bit line BL based on a column address, and applies a voltage necessary for respective operations to the bit line EL. Further, the column decoder 13 determines data retained in the memory cells MC by detecting and amplifying signals generated in the bit lines BL.

The control circuit 14 provides the row address, the column address, and data to the row decoder 12 and the column decoder 13 based on addresses and data inputted from outside. Due to this, the control circuit 14 applies predetermined voltages to the selected word line WL and the selected bit line BL, and applies a voltage to the memory cell MC therebetween. More specifically, the control circuit 14 performs four applying operations, namely of a forming pulse, a set pulse, a reset pulse, and a cure pulse. The forming pulse applying operation is performed on variable resistive elements that have just been manufactured. The variable resistive elements that have just been manufactured are in a very high resistance state (resistance state higher than a reset state), and the forming pulse is applied so as to cause the elements to be in an operable state. The set pulse applying operation applies the set pulse to the variable resistive elements so as to cause the variable resistive elements to transition from a high resistance state (reset state) to a low resistance state (set state). The reset pulse applying operation applies the reset pulse to the variable resistive elements so as to cause the variable resistive elements to transition from the low resistance state (set state) to the high resistance state (reset state). The cure pulse applying operation applies the cure pulse if resistance values of the variable resistive elements do not decrease to a predetermined value or less by the set pulse applying operation, or applies the cure pulse to the variable resistive elements that have exceeded a predetermined pulse number (retry number). The cure pulse has a polarity that is opposite of a polarity of the set pulse, and applies a larger stress on the variable resistive elements than the set pulse.

Figure 2:
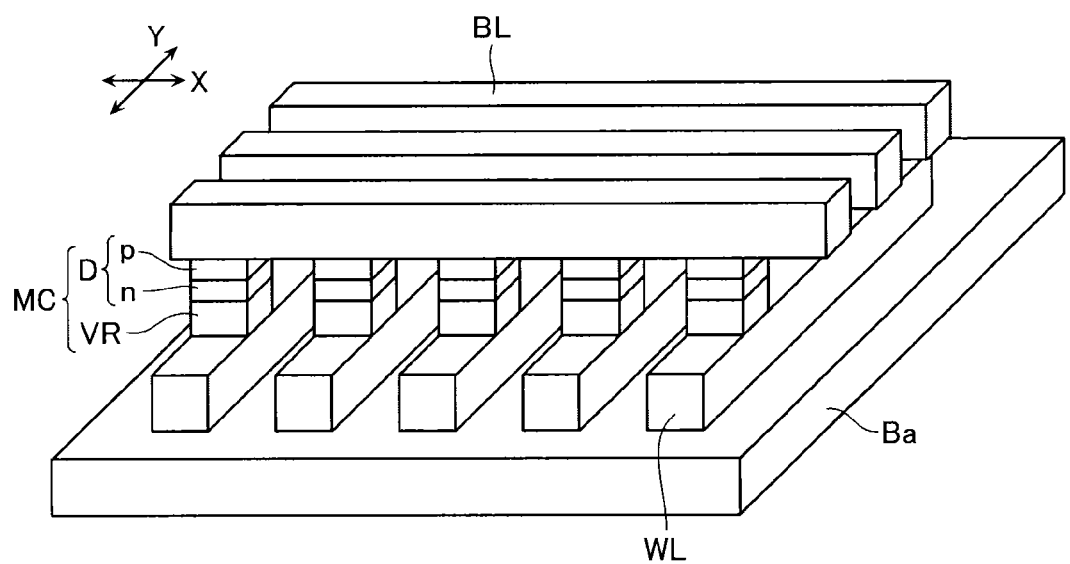
FIG. 2 is a perspective diagram showing a part of a memory cell array 11 of the embodiment.

FIG. 2 is a perspective diagram showing a part of the memory cell array 11. The word lines WL are disposed in an X direction that is parallel to a semiconductor substrate Ba at a predetermined pitch, and extend in a Y direction. The bit lines BL disposed in the Y direction at a predetermined pitch so as to intersect with the word lines WL, and extend in the X direction. The memory cells MC are connected between the word lines WL and the bit lines BL at portions where the word lines WL and the bit lines BL intersect. Each memory cell MC includes a diode D and a variable resistive element VR that are serially connected. A forward direction of the diodes D is for example a direction that extends from the bit lines BL toward the word lines WL.

The variable resistive elements VR transition their resistance states between the low resistance state (set state) and the high resistance state (reset state) in a bipolar operation mode. When the set pulse is applied, the variable resistive elements VR may transition from the high resistance state (reset state) to the low resistance state (set state). Further, when the reset pulse having an opposite polarity as that of the set operation is applied, the variable resistive elements VR may transition from the low resistance (set state) state to the high resistance state (reset state).

As the variable resistive elements VR, PCRAM, CBRAM, ReRAM and the like as described below may be used. The PCRAM changes its resistance value by a phase change between a crystalline state and an amorphous state such as in chalcogenide and the like. The CBRAM changes its resistance value by forming a crosslink (contacting bridge) between electrodes by educing metal positive ions, or by destructing the crosslink by ionizing the educed metal. The ReRAM changes its resistance value by an application of a voltage or a current. This ReRAM can roughly be categorized into those in which the resistance change occurs due to a presence or an absence of electrons trapped in an electron trap existing in an electrode interface, and those in which the resistance change occurs due to a presence or an absence of a conductive path generated by oxygen defects and the like. In the case of the ReRAM, $ZnMn_2O_4$, $NiO$, $TiO_2$, $SrZrO_3$, $Pr_{0.7}Ca_{0.3}MnO_3$ and the like may be used as a material thereof.

Next, the respective operations to be performed on the memory cells MC will be described with reference to FIG. 3 to FIG. 10. In the embodiment, the control circuit 14 performs the forming pulse applying operation, the set pulse applying operation, the reset pulse applying operation, and the cure pulse applying operation to the memory cells MC.

Figure 3:
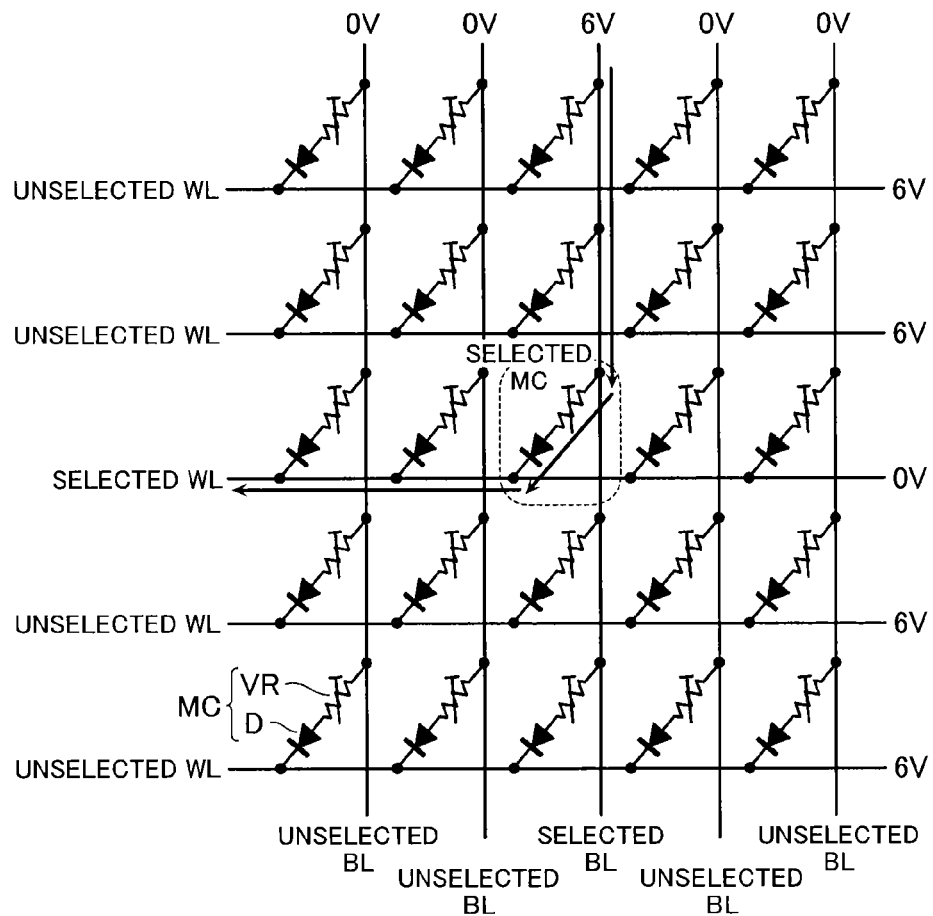
FIG. 3 is a schematic diagram showing a forming pulse applying operation of the embodiment.
Figure 4:
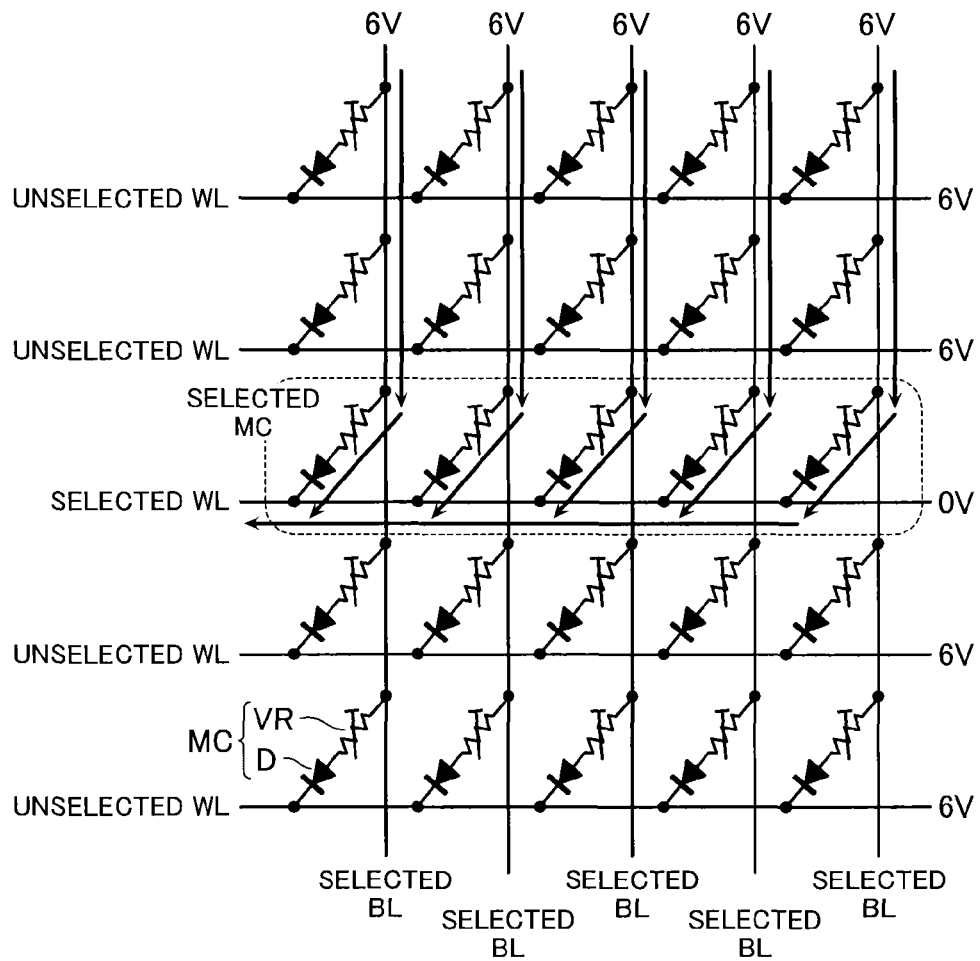
FIG. 4 is a schematic diagram showing the forming pulse applying operation of the embodiment.

Firstly, summary of the forming pulse applying operation will be described with reference to FIG. 3 and FIG. 4. FIG. 3 and FIG. 4 are schematic diagrams showing the forming pulse applying operation. The forming pulse applying operation is performed to decrease the resistance values of the variable resistive elements VR so as to cause the variable resistive elements to be in a state capable of transitioning between the high resistance state (reset state) and the low resistance state (set state). The forming pulse applying operation is performed to the memory cells MC that have just been manufactured. That is, the forming pulse applying operation is performed on the memory cells MC (variable resistive elements VR) to which the set pulse applying operation and the reset pulse applying operation have not been performed. The memory cells MC that have just been manufactured have very high resistance values just after the manufacture, and do not easily change their resistance values. In the forming pulse applying operation, the control circuit 14 applies the forming pulse to a selected memory cell MC.

As shown in FIG. 3, in the forming pulse applying operation, a voltage of a selected word line WL is set at 0V, and a voltage of unselected word lines WL is set at 6V. A voltage of a selected bit line BL is set at 6V, and a voltage of unselected bit lines BL is set at 0V. Accordingly, the forming pulse of 6V in a forward bias direction of a diode D is applied to the selected memory cell MC. By this forming pulse, the variable resistive element VR in the selected memory cell MC has its resistance value decreased, and may come to be in the state capable of transitioning between the high resistance state (reset state) and the low resistance state (set state).

In the above FIG. 3, one piece of the selected memory cell MC becomes a target of the forming pulse applying operation. Alternatively, as shown in FIG. 4, a plurality of selected memory cells MC mutually connected to the selected word line WL may be the target of the forming pulse applying operation. In this case, the voltage of 6V is applied to a plurality of selected bit lines BL.

Figure 5:
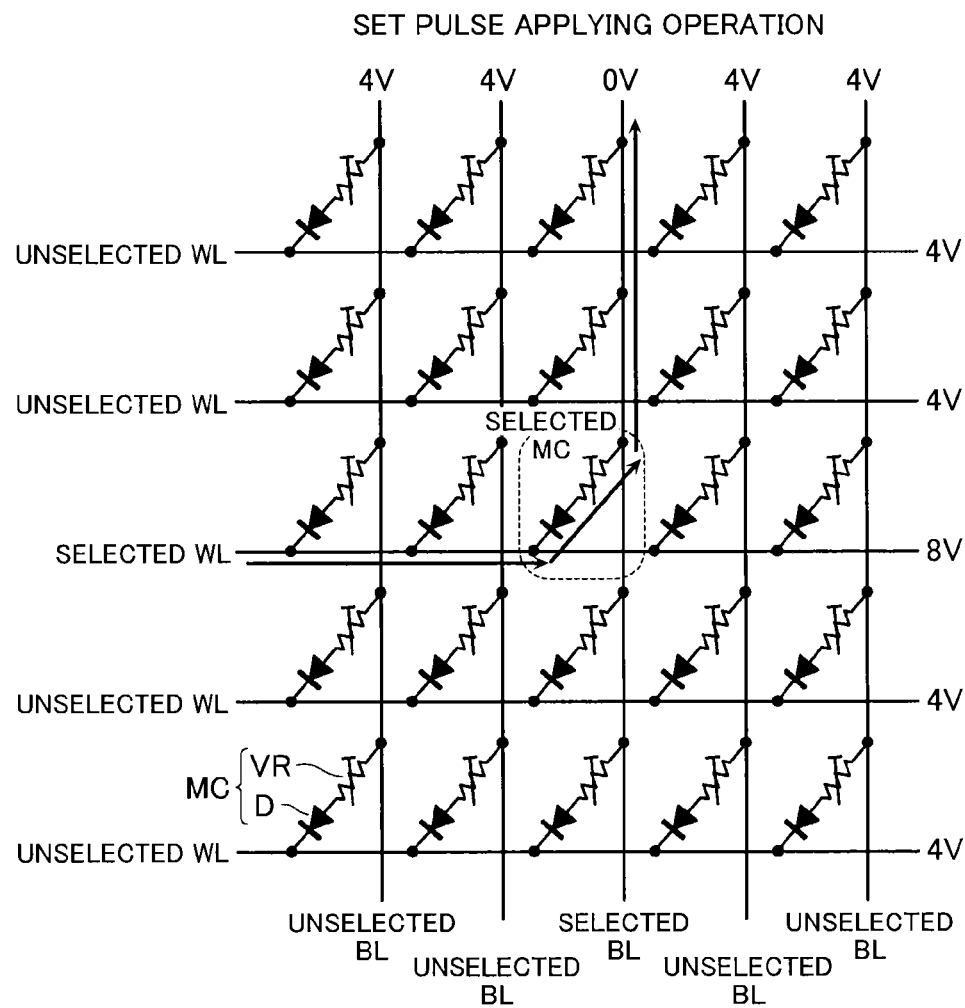
FIG. 5 is a schematic diagram showing a set pulse applying operation of the embodiment.

Next, summary of the set pulse applying operation will be described with reference to FIG. 5. FIG. 5 is a schematic diagram showing the set pulse applying operation. The set pulse applying operation is performed to cause the variable resistive element VR in the selected memory cell MC to change from the high resistance state (reset state) to the low resistance state (set state). In the set pulse applying operation, the control circuit 14 applies the set pulse to the selected memory cell MC. As shown in FIG. 5, in the set pulse applying operation, the voltage of the selected word line WL is set at 8V, and the voltage of the unselected word lines WL is set at 4V. The voltage of the selected bit line BL is set at 0V, and the voltage of the unselected bit lines BL is set at 4V. Accordingly, the set pulse of 8V that reaches a breakdown voltage of the diode D in a reverse biasing direction of the diode D is applied to the selected memory cell MC. The variable resistive elements VR in the selected memory cell MC may be caused to transition from the high resistance state (reset state) to the low resistance state (set state) by this set pulse.

Figure 6:
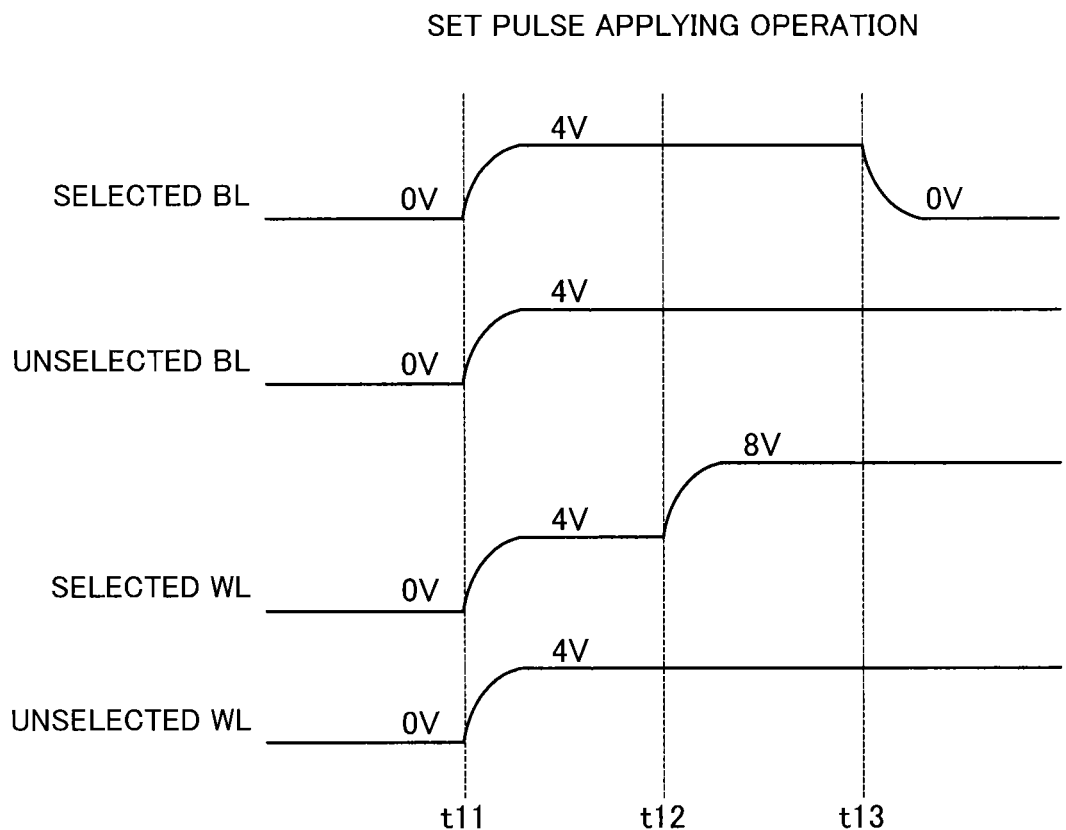
FIG. 6 is a timing chart showing the set pulse applying operation of the embodiment.

Next, timing of the set pulse applying operation will be described with reference to FIG. 6. FIG. 6 is a timing chart showing the set pulse applying operation. As shown in FIG. 6, at time t11, the voltages of the selected word line WL, the unselected word lines WL, the selected bit line BL, and the unselected bit lines BL are raised from 0V to 4V. Next, at time t12, the voltage of the selected word line WL is raised from 4V to 8V. Then, at time t13, the voltage of the selected bit line BL is reduced from 4V to 0V. After this time t13, the set pulse of 8V in the reverse biasing direction of the diode D is applied to the selected memory cell MC.

Figure 7:
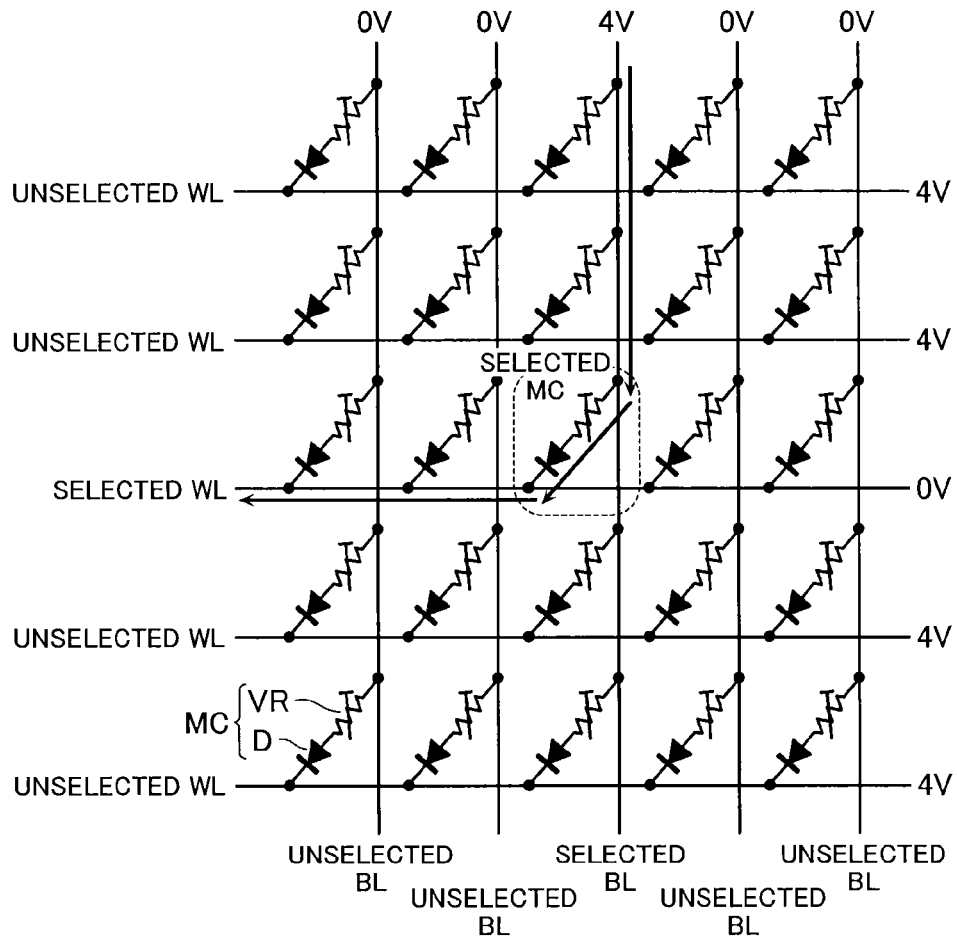
FIG. 7 is a schematic diagram showing a reset pulse applying operation of the embodiment.

Next, summary of the reset pulse applying operation will be described with reference to FIG. 7. FIG. 7 is a schematic diagram showing the reset pulse applying operation. The reset pulse applying operation is performed to cause the variable resistive element VR in the selected memory cell MC to change from the low resistance state (set state) to the high resistance state (reset state). In the reset pulse applying operation, the control circuit 14 applies the reset pulse to the selected memory cell MC. As shown in FIG. 7, in the reset pulse applying operation, the voltage of the selected word line WL is set at 0V, and the voltage of the unselected word lines WL is set at 4V. The voltage of the selected bit line BL is set at 4V, and the voltage of the unselected bit lines BL is set at 0V. Accordingly, the reset pulse of 4V in the forward biasing direction of the diode D is applied to the selected memory cell MC. The variable resistive element VR in the selected memory cell MC may be caused to transition from the low resistance state (set state) to the high resistance state (reset state) by this reset pulse.

Figure 8:
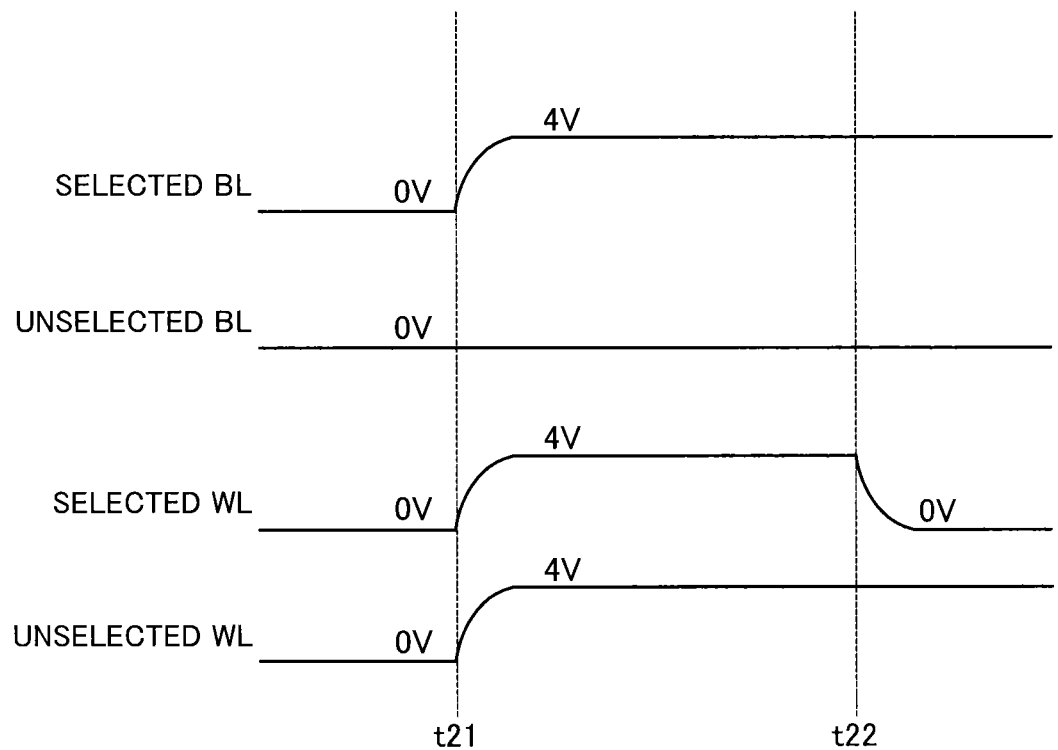
FIG. 8 is a timing chart showing the reset pulse applying operation of the embodiment.

Next, timing of the reset pulse applying operation will be described with reference to FIG. 8. FIG. 8 is a timing chart of the reset pulse applying operation. As shown in FIG. 8, at time t21, the voltages of the selected word line WL, the unselected word lines WL, and the selected bit line BL are raised from 0V to 4V. Next, at time t22, the voltage of the selected word line WL is decreased from 4V to 0V. After this time t22, the reset pulse of 4V in the forward biasing direction of the diode D is applied to the selected memory cell MC.

Figure 9:
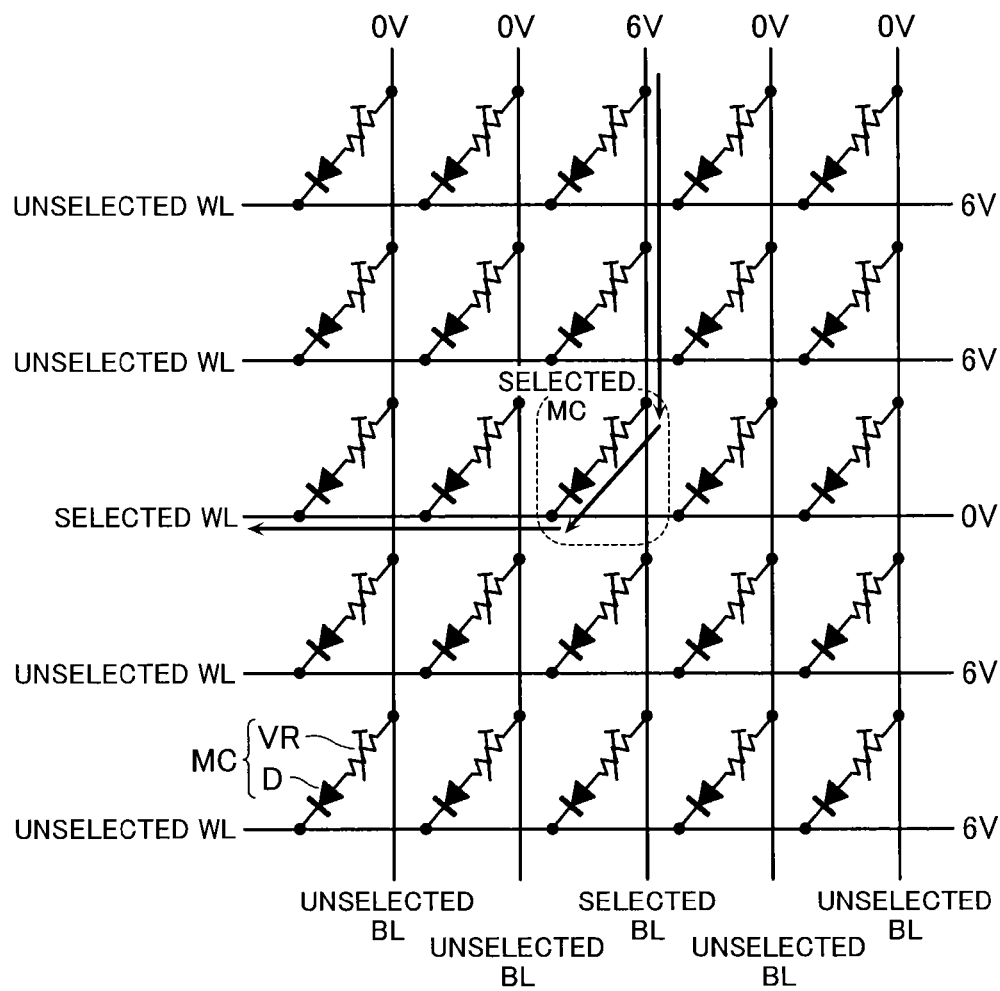
FIG. 9 is a schematic diagram showing a cure pulse applying operation of the embodiment.

Next, summary of the cure pulse applying operation will be described with reference to FIG. 9. FIG. 9 is a schematic diagram showing the cure pulse applying operation. The cure pulse is applied as a relief pulse for recovering memory cells that cannot adequately transition to the set state. That is, most of the memory cells that cannot adequately transition to the set state by applying the set pulse are often in a very high resistance state (resistance state higher than the reset state) similar to the state prior to the forming. Due to this, by applying a pulse that is the same or similar to the forming pulse as the cure pulse to the memory cells, the transition to the set state can be enhanced. The cure pulse applying operation is performed to decrease the resistance value of the variable resistive element VR, and cause the variable resistive element VR to be in the state capable of transitioning between the high resistance state (reset state) and the low resistance state (set state). The cure pulse applying operation is performed when the resistance value of the variable resistive element VR does not decrease to a predetermined value or less after the set pulse applying operation is performed. In the cure pulse applying operation, the control circuit 14 applies the cure pulse to the selected memory cell MC.

As shown in FIG. 9, in the cure pulse applying operation, the voltage of the selected word line WL is set at 0V, and the voltage of the unselected word lines WL is set at 6V. The voltage of the selected bit line BL is set at 6V, and the voltage of the unselected bit lines BL is set at 0V. Accordingly, the cure pulse of 6V in the forward biasing direction of the diode D is applied to the selected memory cell MC. The resistance value of the variable resistive element VR in the selected memory cell MC is caused to decrease by this cure pulse, whereby the state capable of transitioning between the high resistance state (reset state) and the low resistance state (set state) may be assumed.

Figure 10:
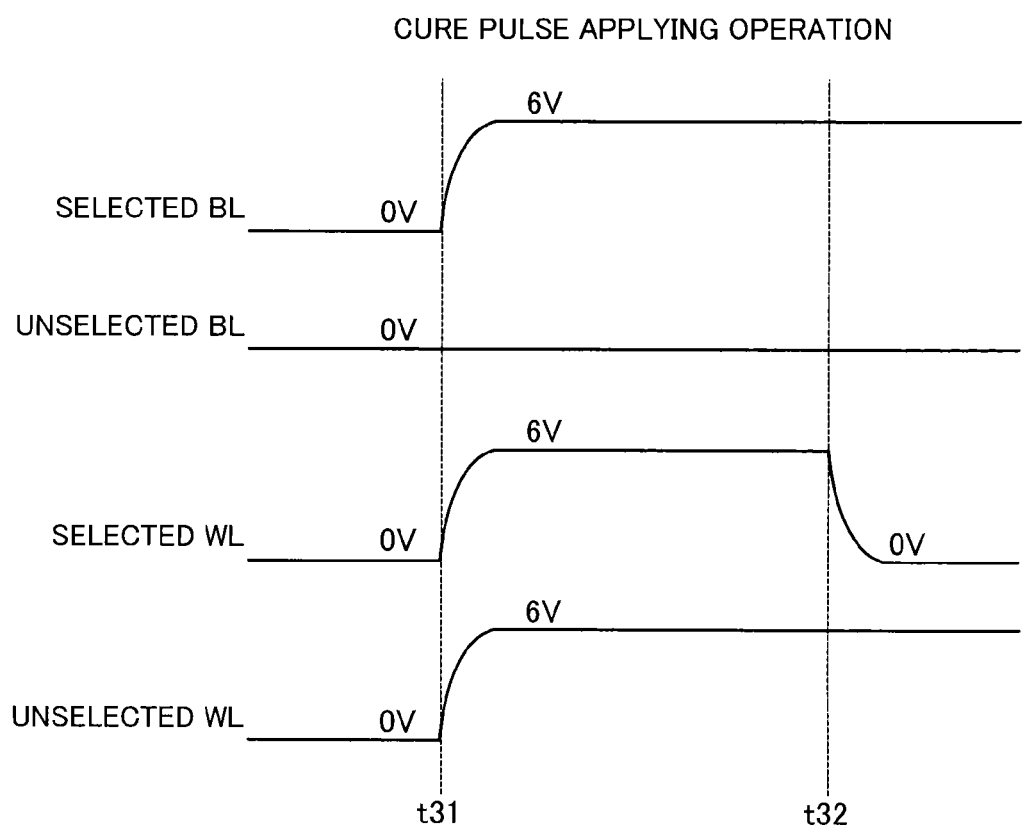
FIG. 10 is a timing chart showing the cure pulse applying operation of the embodiment.

Next, timing of the cure pulse applying operation will be described with reference to FIG. 10. FIG. 10 is a timing chart of the cure pulse applying operation. As shown in FIG. 10, at time t31, the voltages of the selected word line WL, the unselected word lines WL, and the selected bit line BL are raised from 0V to 6V. Next, at time t32, the voltage of the selected word line WL is decreased from 6V to 0V. After this time t32, the cure pulse of 6V in the forward biasing direction of the diode D is applied to the selected memory cell MC.

Next, a flow chart of the set operation of the embodiment will be described with reference to FIG. 11. In the embodiment, the set operation includes the set pulse applying operation and the cure pulse applying operation, and is an operation to cause the variable resistive elements VR to be in the low resistance state (set state). Note that, the set operation shown in FIG. 11 is performed by the control circuit 14.

Figure 11:
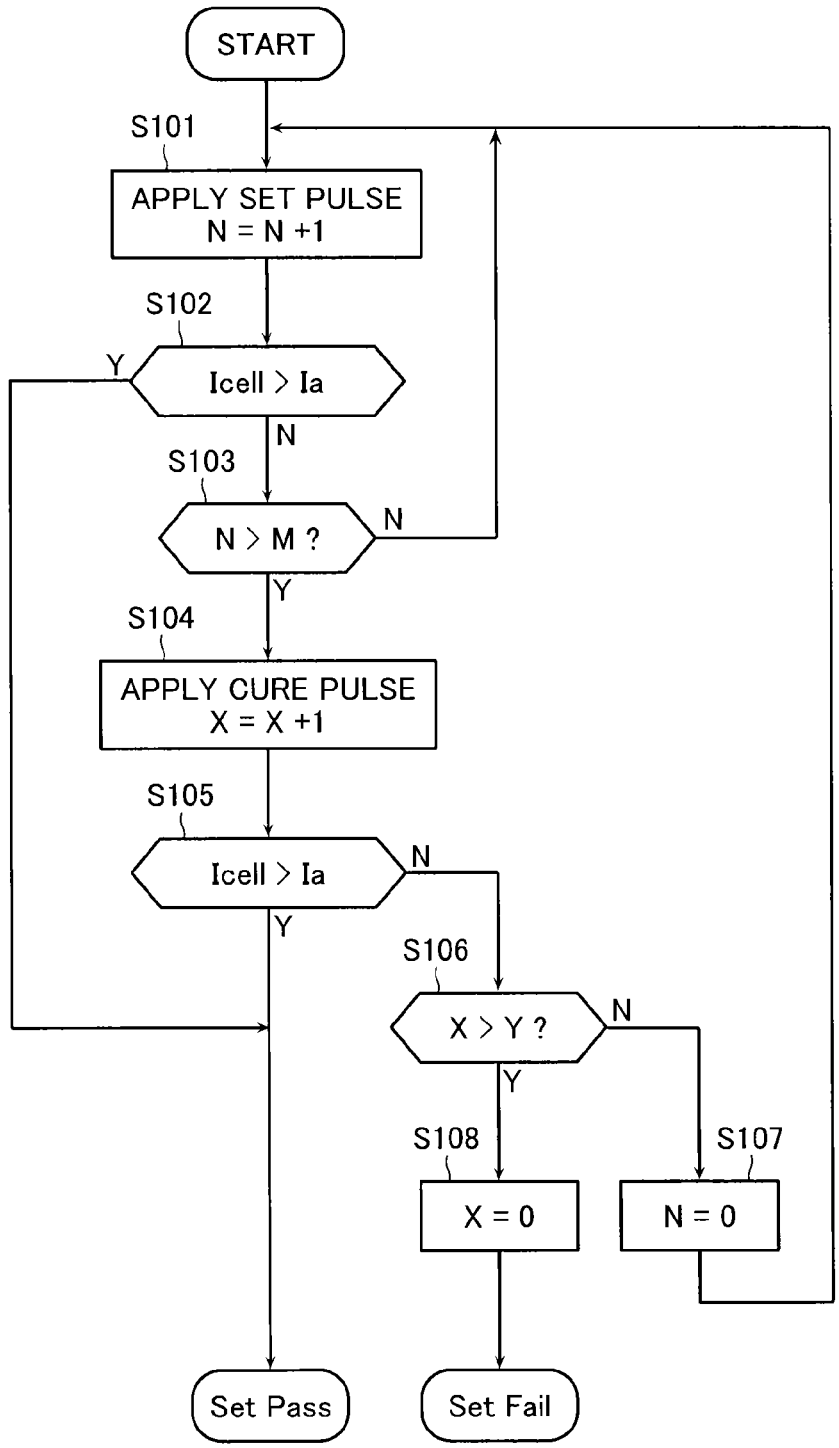
FIG. 11 is a flow chart showing a set operation of the embodiment.

As shown in FIG. 11, firstly, the set pulse is applied to the selected memory cell MC (set pulse applying operation), and a set pulse applied number N is counted (S101). Next, a determination is made on whether a cell current Icell flows in the memory cell MC is larger than a current value Ia (current value of a set level) or not (S102). If the cell current Icell is larger than the current Ia, the variable resistive element VR in the memory cell MC is determined as having transitioned to the set state (low resistance state).

In step S102, if the cell current Icell is larger than the current value Ia (S102, Y), the set operation is determined as having been completed (Set Pass). On the other hand, if the cell current Icell is at or less than the current value Ia (S102, N), a determination is made on whether the set pulse applied number N is larger than a number M or not (S103).

In step S103, if the set pulse applied number N is at or less than the number M (S103, N), the process from step S101 is performed again. On the other hand, if the set pulse applied number N is larger than the number M (S103, Y), the cure pulse is applied to the selected memory cell MC (cure pulse applying operation), and a cure pulse applied number X is counted (S104).

Subsequently, a determination is made on whether the cell current Icell is larger than the current value Ia or not (S105). If the cell current Icell is larger than the current Ia, the variable resistive element VR in the memory cell MC is determined as having decreased its resistance value, and have transitioned to the state capable of transitioning between the high resistance state (reset state) and the low resistance state (set state).

In step S105, if the cell current Icell is larger than the current value Ia (S105, Y), the set operation is determined as having been completed (Set Pass). On the other hand, if the cell current Icell is at or less than the current value Ia (S105, N), a determination is made on whether the cure pulse applied number X is larger than a number Y or not (S106).

In step S106, if the cure pulse applied number X is at or less than the number Y (S106, N), after resetting the set pulse applied number N to "0" (S107), the process from step S101 is performed again. On the other hand, if the cure pulse applied number X is larger than the number Y (S106, Y), after resetting the cure pulse applied number X to "0" (S108), the set operation is determined as having failed (Set Fail).

As above, by applying the cure pulse, the embodiment decreases the resistance value of the variable resistive element VR remained in the high resistance state, and can cause the variable resistive element VR to be in the state capable of transitioning between the high resistance state (reset state) and the low resistance state again (set state). Here, since the cure pulse has a higher voltage and longer application time than the set pulse, the cure pulse applying operation applies greater stress on the memory cells MC than the set pulse applying operation. Thus, in the embodiment, the cure pulse applying operation is performed only in the case where the set pulse applying operation has been performed M times or more. Due to this, the embodiment can suppress the stress to be applied onto the memory cells MC.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the cure pulse applying operation can be applied at a testing stage of determining whether the memory cells MC are capable of correct operation. Further, the number M of the set pulse applying operation shown in FIG. 11 may be set based on a number of failed memory cells included in the memory cell array 11 that had been determined in the testing stage.

What is claimed is:

1. A semiconductor storage device, comprising:
  a memory cell array in which memory cells comprising variable resistive elements are disposed at intersections of a plurality of first lines and a plurality of second lines; and
  a control circuit configured to apply a voltage to a memory cell disposed at an intersection of a selected first line and a selected second line by applying predetermined voltages to the selected first line and the selected second line, the control circuit being configured to perform:
    a set pulse applying operation of applying a set pulse to a variable resistive element so as to cause the variable resistive element to transition from a high resistance state to a low resistance state, and
    a cure pulse applying operation of applying a cure pulse to the variable resistive element if a resistance value of the variable resistive element does not decrease to a predetermined value or less by the set pulse applying operation,
    the cure pulse having a polarity that is opposite of a polarity of the set pulse, and having an application time longer than that of the set pulse,
    the control circuit performing the cure pulse applying operation if the resistance value of the variable resistive element does not decrease to the predetermined value or less, despite having performed the set pulse applying operation for a first number of times, and
    the first number of times being set based on a number of failed memory cells included in the memory cell array.

2. The semiconductor storage device according to claim 1, wherein
  the control circuit determines the variable resistive element as having failed if the resistance value of the variable resistive element does not decrease to the predetermined value or less, despite having performed the cure pulse applying operation for a second number of times.

3. The semiconductor storage device according to claim 1, wherein
  the control circuit performs a forming pulse applying operation of applying a forming pulse on variable resistive elements to which the set pulse applying operation has not been performed, and
  the forming pulse has a polarity that is opposite of the polarity of the set pulse, and is larger than the set pulse.

4. The semiconductor storage device according to claim 1, wherein
  the control circuit performs a reset pulse applying operation of applying a reset pulse to the variable resistive element so as to cause the variable resistive element to transition from the low resistance state to the high resistance state, and
  the reset pulse has a polarity that is opposite of the polarity of the set pulse, and is smaller than the set pulse.

5. The semiconductor storage device according to claim 1, wherein the memory cells comprise rectifying elements serially connected to the variable resistive elements.

6. The semiconductor storage device according to claim 5, wherein
  the set pulse is applied in a reverse biasing direction of the rectifying elements, and
  the cure pulse is applied in a forward biasing direction of the rectifying elements.

7. A semiconductor storage device, comprising:
  a memory cell array in which memory cells comprising variable resistive elements are disposed at intersections of a plurality of first lines and a plurality of second lines; and
  a control circuit configured to apply a voltage to a memory cell disposed at an intersection of a selected first line and a selected second line by applying predetermined voltages to the selected first line and the selected second line, the control circuit being configured to perform:
    a set pulse applying operation of applying a set pulse to a variable resistive element so as to cause the variable resistive element to transition from a high resistance state to a low resistance state; and
    a cure pulse applying operation of applying a cure pulse to the variable resistive element if a resistance value of the variable resistive element does not decrease to a predetermined value or less by the set pulse applying operation,
    the cure pulse having a polarity that is opposite of a polarity of the set pulse, and having an application time longer than that of the set pulse,
    in the cure pulse applying operation, the control circuit increasing voltages of the selected first line, the selected second line, and unselected second lines from a first voltage to a second voltage, and maintaining a voltage of unselected first lines at the first voltage, and thereafter,
    the control circuit decreasing the voltage of the selected second line to the first voltage, maintaining the voltages of the selected first line and the unselected second lines at the second voltage, and maintaining the voltage of the unselected first lines at the first voltage.

8. A semiconductor storage device, comprising:
  a memory cell array in which memory cells comprising variable resistive elements are disposed at intersections of a plurality of first lines and a plurality of second lines; and
  a control circuit configured to apply a voltage to a memory cell disposed at an intersection of a selected first line and a selected second line by applying predetermined voltages to the selected first line and the selected second line, the control circuit being configured to perform:
    a set pulse applying operation of applying a set pulse to a variable resistive element so as to cause the variable resistive element to transition from a high resistance state to a low resistance state; and
    a cure pulse applying operation of applying a cure pulse to the variable resistive element if a resistance value of the variable resistive element does not decrease to a predetermined value or less by the set pulse applying operation,
    the cure pulse having a polarity that is opposite of a polarity of the set pulse, and having an application time longer than that of the set pulse,
    in the set pulse applying operation, the control circuit increasing voltages of the selected first line, unselected first lines, and unselected second lines from a third voltage to a fourth voltage, and increasing a voltage of the selected second line from the third voltage to a fifth voltage, and thereafter, the control circuit decreasing the voltage of the selected first line to the third voltage, maintaining the voltages of the unselected first lines and the unselected second lines at the fourth voltage, and maintaining the voltage of the selected second line at the fifth voltage, and the fifth voltage being larger than the fourth voltage.

9. A semiconductor storage device, comprising:

a memory cell array in which memory cells comprising variable resistive elements are disposed at intersections of a plurality of first lines and a plurality of second lines; and a control circuit configured to apply a voltage to a memory cell disposed at an intersection of a selected first line and a selected second line by applying predetermined voltages to the selected first line and the selected second line, the control circuit being configured to perform:

a set pulse applying operation of applying a set pulse to a variable resistive element so as to cause the variable resistive element to transition from a high resistance state to a low resistance state; and a cure pulse applying operation of applying a cure pulse to the variable resistive element if a resistance value of the variable resistive element does not decrease to a predetermined value or less by the set pulse applying operation, the cure pulse having a polarity that is opposite of a polarity of the set pulse, and having an application time longer than that of the set pulse, the control circuit performing a reset pulse applying operation of applying a reset pulse to the variable resistive element so as to cause the variable resistive element to transition from the low resistance state to the high resistance state, the reset pulse having a polarity that is opposite of the polarity of the set pulse, and is smaller than the set pulse, in the reset pulse applying operation, the control circuit increasing voltages of the selected first line, the selected second line, and unselected second lines from a sixth voltage to a seventh voltage, and maintaining a voltage of unselected first lines at the sixth voltage, and thereafter, the control circuit decreasing the voltage of the selected second line to the sixth voltage, maintaining the voltages of the selected first line and the unselected second lines at the seventh voltage, and maintaining the voltage of the unselected first lines at the sixth voltage.

10. The semiconductor storage device according to claim 3, wherein the control circuit performs the forming pulse applying operation on one of the memory cells.

11. The semiconductor storage device according to claim 3, wherein the control circuit performs the forming pulse applying operation simultaneously on a plurality of memory cells commonly connected to the second line.

12. A method of controlling data in a semiconductor storage device that includes a memory cell array in which memory cells comprising variable resistive elements disposed at intersections of a plurality of first lines and a plurality of second lines, the method comprising:

applying a voltage to a memory cell disposed at an intersection of a selected first line and a selected second line by applying predetermined voltages to the selected first line and the selected second line; and performing:

a set pulse applying operation of applying a set pulse to a variable resistive element so as to cause the variable resistive element to transition from a high resistance state to a low resistance state, and a cure pulse applying operation of applying a cure pulse to the variable resistive element if a resistance value of the variable resistive element does not decrease to a predetermined value or less by the set pulse applying operation, the cure pulse having a polarity that is opposite of a polarity of the set pulse, and having an application time longer than that of the set pulse, the cure pulse applying operation being performed if the resistance value of the variable resistive element does not decrease to the predetermined value or less, despite having performed the set pulse applying operation for a first number of times, and the first number of times being set based on a number of failed memory cells included in the memory cell array.

13. The method of controlling data in a semiconductor storage device according to claim 12, wherein the variable resistive element is determined as having failed if the resistance value of the variable resistive element does not decrease to the predetermined value or less, despite having performed the cure pulse applying operation for a second number of times.

14. The method of controlling data in a semiconductor storage device according to claim 12, further comprising:

performing a forming pulse applying operation of applying a forming pulse on variable resistive elements to which the set pulse applying operation has not been performed, and the forming pulse having a polarity that is opposite of the polarity of the set pulse, and being larger than the set pulse.

15. The method of controlling data in a semiconductor storage device according to claim 12, further comprising:

performing a reset pulse applying operation of applying a reset pulse to the variable resistive element so as to cause the variable resistive element to transition from the low resistance state to the high resistance state, and the reset pulse having a polarity that is opposite of the polarity of the set pulse, and being smaller than the set pulse.

* * * * *